(12) United States Patent
Wang et al.

(10) Patent No.: US 10,811,436 B2
(45) Date of Patent: Oct. 20, 2020

(54) ARRAY SUBSTRATE HAVING A CONVEX STRUCTURE

(71) Applicant: BOE TECHNOLOGY GROUP CO., LTD., Beijing (CN)

(72) Inventors: Guoying Wang, Beijing (CN); Zhen Song, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/992,352

(22) Filed: May 30, 2018

(65) Prior Publication Data

US 2019/0109153 A1    Apr. 11, 2019

(30) Foreign Application Priority Data

Oct. 11, 2017 (CN) .......................... 2017 1 0943227

(51) Int. Cl.
| | |
|---|---|
| *H01L 27/12* | (2006.01) |
| *H01L 27/32* | (2006.01) |
| *H01L 51/52* | (2006.01) |
| *H01L 27/15* | (2006.01) |

(52) U.S. Cl.
CPC ........ *H01L 27/124* (2013.01); *H01L 27/1248* (2013.01); *H01L 27/1262* (2013.01); *H01L 27/3258* (2013.01); *H01L 51/5209* (2013.01); *H01L 51/5218* (2013.01); *H01L 51/5271* (2013.01); *H01L 27/156* (2013.01); *H01L 27/3272* (2013.01)

(58) Field of Classification Search
CPC ............... H01L 27/124; H01L 27/1248; H01L 27/1262; H01L 27/3258; H01L 51/5209; H01L 51/5218; H01L 51/5271
See application file for complete search history.

(56) References Cited

U.S. PATENT DOCUMENTS

| | | | | |
|---|---|---|---|---|
| 6,933,671 | B2* | 8/2005 | Nakanishi | G09G 3/3233 313/500 |
| 6,967,435 | B2* | 11/2005 | Park | H01L 27/322 313/112 |
| 7,132,308 | B2* | 11/2006 | Park | H01L 27/3246 438/82 |
| 7,170,225 | B2* | 1/2007 | Han | H01L 27/3267 313/503 |

(Continued)

*Primary Examiner* — Ida M Soward
(74) *Attorney, Agent, or Firm* — Nath, Goldberg & Meyer; Joshua B. Goldberg

(57) ABSTRACT

The present disclosure provides an array substrate and a method for manufacturing the same, a display apparatus. The array substrate includes a base substrate and a plurality of pixel units arranged on the base substrate, each of the pixel units includes a thin film transistor and an electroluminescent device, the thin film transistor and the electroluminescent device are successively arranged on the base substrate in a direction away from the base substrate, the electroluminescent device includes a first electrode, a light emitting layer and a second electrode which are successively arranged in the direction away from the base substrate, the first electrode includes a reflective material, a convex structure is provided between first electrodes of any two adjacent electroluminescent devices, and the first electrodes of the electroluminescent devices extend to side walls of the convex structure, respectively.

11 Claims, 2 Drawing Sheets

(56) References Cited

U.S. PATENT DOCUMENTS

| | | | | |
|---|---|---|---|---|
| 7,221,091 | B2* | 5/2007 | Park | H01L 27/3253 |
| | | | | 313/292 |
| 7,312,571 | B2* | 12/2007 | Kim | H01L 27/3244 |
| | | | | 313/504 |
| 8,502,211 | B2* | 8/2013 | Lee | H01L 27/3267 |
| | | | | 257/40 |
| 9,048,203 | B2* | 6/2015 | Yamazaki | H01L 27/322 |
| | | | | 257/98 |
| 9,224,791 | B2* | 12/2015 | Kim | H01L 27/3246 |
| 9,484,549 | B2* | 11/2016 | Jung | H01L 51/5243 |
| 9,570,706 | B2* | 2/2017 | Yim | H01L 27/1248 |
| 9,577,203 | B2* | 2/2017 | Kim | H01L 51/0097 |
| 9,882,169 | B2* | 1/2018 | Kim | H01L 51/5271 |
| 9,893,285 | B2* | 2/2018 | Kim | H01L 51/5225 |
| 10,141,383 | B2* | 11/2018 | Kim | H01L 27/3246 |
| 10,199,607 | B2* | 2/2019 | Kim | H01L 27/3218 |
| 10,310,650 | B2* | 6/2019 | Heo | G06F 3/044 |
| 2007/0246723 | A1* | 10/2007 | Moriya | H01L 27/1292 |
| | | | | 257/98 |
| 2014/0027729 | A1* | 1/2014 | So | H01L 51/525 |
| | | | | 257/40 |
| 2014/0346449 | A1* | 11/2014 | Choi | H01L 27/3211 |
| | | | | 257/40 |
| 2015/0325629 | A1* | 11/2015 | Oooka | H01L 51/525 |
| | | | | 257/40 |
| 2016/0079325 | A1* | 3/2016 | Lee | H01L 27/3246 |
| | | | | 257/40 |
| 2016/0172422 | A1* | 6/2016 | Kim | H01L 27/3246 |
| | | | | 257/40 |
| 2017/0330921 | A1* | 11/2017 | Lee | H01L 51/5256 |
| 2017/0338292 | A1* | 11/2017 | Choi | H01L 27/3216 |
| 2017/0338293 | A1* | 11/2017 | Guo | H01L 27/3267 |
| 2018/0366682 | A1* | 12/2018 | Kang | H01L 27/3246 |

* cited by examiner forming a pattern including an active layer of a thin film transistor on a base substrate by a patterning process forming a pattern including a gate insulation layer and a gate above the active layer by a patterning process forming an interlayer dielectric layer above the gate, and etching the interlayer dielectric layer at positions corresponding to the source contact region and the drain contact region of the active layer to form a source contact hole and a drain contact hole forming a pattern including a source and a drain of the thin film transistor above the interlayer dielectric layer by a patterning process forming an interlayer insulation layer and a convex structure above the source and the drain forming a first electrode of an electroluminescent device above the interlayer insulation layer

Fig. 2

ARRAY SUBSTRATE HAVING A CONVEX STRUCTURE

CROSS-REFERENCE TO RELATED APPLICATION

The present disclosure claims priority to of the Chinese patent application No. 201710943227.3 filed on Oct. 11, 2017, entitled "Array Substrate and Method for manufacturing the same, Display Apparatus", the entire contents of which are incorporated herein by reference.

TECHNICAL FIELD

The present disclosure relates to the field of display technology, and particularly to an array substrate, a method for manufacturing an array substrate, and a display apparatus.

BACKGROUND

A thin film transistor is sensitive to light, and electrical properties of the thin film transistor will change under illumination. In a case where the thin film transistor is applied to a display panel with an electroluminescent device, light emitted by the electroluminescent device in the display panel may be irradiated to the thin film transistor and thus affect characteristics of the thin film transistor so that a threshold voltage of the thin film transistor drifts significantly.

SUMMARY

Embodiments of the present disclosure provide an array substrate, which includes a base substrate and a plurality of pixel units arranged on the base substrate, each of the pixel units includes a thin film transistor and an electroluminescent device, the thin film transistor and the electroluminescent device are successively arranged on the base substrate in a direction away from the base substrate, the electroluminescent device includes a first electrode, a light emitting layer and a second electrode which are successively arranged in the direction away from the base substrate, the first electrode includes a reflective material, a convex structure is provided between first electrodes of any two adjacent electroluminescent devices, and the first electrodes of the electroluminescent devices extend to side walls of the convex structure, respectively.

In some implementations, the first electrode of the electroluminescent device is provided above the thin film transistor, an interlayer insulation layer is provided between the first electrode of the electroluminescent device and the thin film transistor, and the convex structure is provided on the interlayer insulation layer.

In some implementations, an orthographic projection of the first electrode of the electroluminescent device on the base substrate covers an orthographic projection of the thin film transistor on the base substrate.

In some implementations, the interlayer insulation layer includes a planarization layer, and the convex structure and the planarization layer are formed by a single layer.

In some implementations, the interlayer insulation layer further includes a passivation layer formed between the thin film transistor and the planarization layer.

In some implementations, in each of the pixel units, the first electrode of the electroluminescent device is connected to the thin film transistor through a via hole penetrating through the interlayer insulation layer.

In some implementations, an end of the convex structure proximal to the base substrate is wider than an end of the convex structure distal to the base substrate, and the side walls of the convex structure are inclined.

In some implementations, a portion of the first electrode of the electroluminescent device which extends to the side wall of the convex structure is conformal to the side wall of the convex structure.

Embodiments of the present disclosure further provide a method for manufacturing an array substrate, the array substrate includes a plurality of pixel units, each of the pixel units includes a thin film transistor and an electroluminescent device, and the method includes steps of: forming the thin film transistor on a base substrate; forming a first electrode, a light emitting layer and a second electrode of the electroluminescent device successively on the thin film transistor such that the first electrode includes a reflective material, a convex structure is formed between first electrodes of any two adjacent electroluminescent devices, and the first electrodes of the electroluminescent devices extend to side walls of the convex structure, respectively.

In some implementations, the step of forming the thin film transistor on the base substrate incudes sub-steps of: forming a pattern including an active layer of the thin film transistor on the base substrate by a patterning process; depositing a gate insulation material layer and a gate metal layer successively above the active layer, and forming a pattern including a gate insulation layer and a gate of the thin film transistor by a patterning process; forming an interlayer dielectric layer above the gate, and etching the interlayer dielectric layer to form a source contact hole and a drain contact hole in the interlayer dielectric layer; forming a pattern including a source and a drain of the thin film transistor above the interlayer dielectric layer by a patterning process such that the source is connected to the active layer through the source contact hole, and the drain is connected to the active layer through the drain contact hole; and forming an interlayer insulation layer above the source and the drain, and wherein the convex structure is provided above the interlayer insulation layer.

In some implementations, the sub-step of forming the interlayer insulation layer includes forming a planarization layer, and wherein the convex structure and the planarization layer are formed by a single patterning process with a same material.

In some implementations, the sub-step of forming the interlayer insulation layer further includes: forming a passivation layer before forming the planarization layer.

In some implementations, the convex structure is formed so that an end of the convex structure proximal to the base substrate is wider than an end of the convex structure distal to the base substrate, and the side walls of the convex structure are inclined.

In some implementations, the first electrode of the electroluminescent device is formed so that a portion of the first electrode of the electroluminescent device which extends to the side wall of the convex structure is conformal to the side wall of the convex structure.

Embodiments of the present disclosure further provide a display device including the array substrate described above.

BRIEF DESCRIPTION OF THE DRAWINGS

FIG. 2 shows a flowchart of a method for manufacturing an array substrate in an embodiment of the present disclosure.

DETAILED DESCRIPTION OF THE EMBODIMENTS

Figure 1:
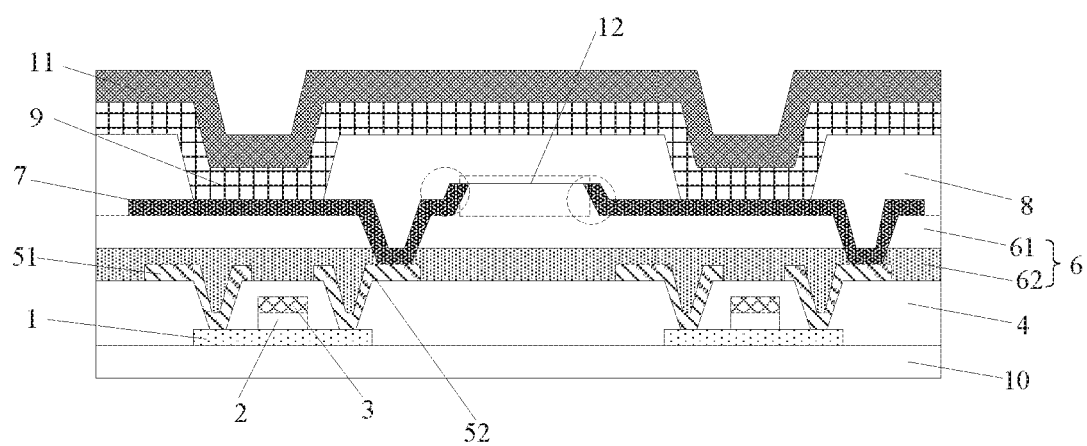
FIG. 1 shows a structural diagram of an array substrate in an embodiment of the present disclosure.

In order to make persons skilled in the art understand technical solutions of the present disclosure better, the technical solutions of the present disclosure will be described in detail below in conjunction with drawings and specific implementations.

FIG. 1 shows a structural diagram of an array substrate in an embodiment of the present disclosure.

In the embodiment, each pixel unit of the array substrate includes a thin film transistor and a top-emitting electroluminescent device.

In order to prevent light emitted by the electroluminescent device from being irradiated to the thin film transistor and affecting properties of the thin film transistor, in the embodiment, the thin film transistor is arranged below the electroluminescent device.

As shown in FIG. 1, the array substrate of the embodiment includes a base substrate 10 and a plurality of pixel units arranged on the base substrate 10, each of the pixel units includes a thin film transistor and a top-emitting electroluminescent device, the thin film transistor and the top-emitting electroluminescent device are arranged successively in a direction away from the base substrate 10, the electroluminescent device includes a first electrode 7, a light emitting layer 9 and a second electrode 11 which are successively arranged on the base substrate 10 in the direction away from the base substrate 10, the first electrode 7 includes a reflective material, that is the first electrode 7 is a reflective electrode, a convex structure 12 is provided between first electrodes 7 of any two adjacent electroluminescent devices, the first electrodes 7 of the electroluminescent devices extend to side walls of the convex structure, respectively, as shown in a dotted line circle in FIG. 1.

In some implementations, in order to prevent light emitted by the electroluminescent device from being irradiated to the thin film transistor and resulting in a threshold voltage shift of the thin film transistor, an orthographic projection of the first electrode 7 of the electroluminescent device on the base substrate 10 fully covers an orthographic projection of the thin film transistor on the base substrate 10.

In the array substrate of the embodiment, the convex structure 12 is provided between the first electrodes 7 of any two adjacent electroluminescent devices, and the first electrodes 7 of the electroluminescent devices extend to the side walls of the convex structure 12, thus most light emitted by the light emitting layer 9 of the electroluminescent device is reflected to the second electrodes 11 by the first electrodes 7 and then is emitted toward outside. Since the first electrode 7 extends to the side walls of the convex structure 12, light leakage at an edge of the first electrode 7 is reduced significantly or avoided, and a light emitting area of the electroluminescent device is increased. Since the light leakage at the edge of the first electrode 7 is reduced significantly or avoided, a case where the thin film transistor of each pixel unit is irradiated by the light leakage at the first electrode 7 of the electroluminescent device in an adjacent pixel unit is avoided, thereby a relatively large threshold voltage shift of the thin film transistor is avoided, and a stability of the thin film transistor is improved.

In the embodiment, as shown in FIG. 1, the convex structure 12 is a structure with narrow top and wide bottom, that is, an end of the convex structure 12 proximal to the base substrate 10 is wider than an end of the convex structure 12 distal to the base substrate 10, the side walls of the convex structure 12 are inclined, a portion of the first electrode 7 of the electroluminescent device which extends to the side wall of the convex structure 12 is conformal to the side wall of the convex structure 12 (i.e., is also inclined), thereby facilitating to reflect most light emitted by the light emitting layer 9 of the electroluminescent device to the second electrodes 11 and then emit the light toward outside.

It should be noted that, one of the first electrode 7 and the second electrode 11 of the electroluminescent device is an anode, and the other one thereof is a cathode. For example, in the embodiment, the first electrode 7 of the electroluminescent device is the anode, and the second electrode 11 is the cathode; or, the first electrode 7 of the electroluminescent device is the cathode, and the second electrode 11 is the anode.

In some implementations, an interlayer insulation layer 6 is provided between the thin film transistor and the first electrode 7 of the electroluminescent device, the convex structure 12 is arranged on the interlayer insulation layer 6, and the first electrode 7 of the electroluminescent device extends to the side wall of the convex structure 12. It should be noted that, each of both ends of the first electrode 7 extends to the side wall of the convex structure 12 closest thereto.

In some implementations, the interlayer insulation layer 6 includes a planarization layer 61, and the convex structure 12 and the planarization layer 61 are formed by a single layer. That is, the convex structure 12 and the planarization layer 61 are formed simultaneously by a single patterning process, thus the convex structure 12 is formed without increasing processes and production cost.

In some implementations, the interlayer insulation layer 6 further includes a passivation layer 62 provided between the thin film transistor and the planarization layer 61, the passivation layer 62 can prevent water vapor, oxygen or the like from contaminating the thin film transistor and the electroluminescent device. In this case, the first electrode 7 of the electroluminescent device can be connected to the thin film transistor through a via hole penetrating through the planarization layer 61 and the passivation layer 62.

The thin film transistor of the embodiment includes any of a polycrystalline silicon thin film transistor, an amorphous silicon thin film transistor, and an oxide thin film transistor. Certainly, the present disclosure is not limited to these types of thin film transistors, and other types of thin film transistors can also be employed.

In some implementations, a top-gate thin film transistor can be employed, and for example, there is no overlapping region between a gate and a source/drain of a self-aligned top-gate thin film transistor, thus the self-aligned top-gate thin film transistor has a small parasitic capacitance and a small delay. In a case where the self-aligned top-gate thin film transistor is applied in the array substrate, a high switching speed is obtained, thereby it is easy to achieve a high resolution display.

As shown in FIG. 1, in the thin film transistor of the embodiment, a gate 3 is arranged above an active layer 1, thus, after forming the gate 3, a source contact region and a drain contact region of the active layer 1 are made to be conductive by using the gate 3 as a mask, so that there is a good conductivity between the active layer 1 and the source 51/the drain 52, which can reduce one mask process. Certainly, the thin film transistor of the embodiment can also be a bottom-gate thin film transistor, that is, a gate of the thin film transistor is arranged below an active layer thereof.

It should be noted that, in practical applications, the source and the drain of the thin film transistor of the embodiment are exchangable, and correspondingly, the source contact region and the drain contact region of the active layer are also exchangable.

An embodiment of the present disclosure provides a method for manufacturing an array substrate, which can manufacture the array substrate of the embodiment described above. The method includes a step of forming a plurality of pixel units on a base substrate 10, each of the pixel units includes a thin film transistor and a top-emitting electroluminescent device, the thin film transistor and the electroluminescent device are arranged successively in a direction away from the base substrate 10, the electroluminescent device includes a first electrode 7, a light emitting layer 9 and a second electrode 11 which are successively arranged on the base substrate 10 in the direction away from the base substrate 10, the first electrode 7 includes a reflective material, that is, the first electrode 7 is a reflective electrode, a convex structure 12 is formed between first electrodes 7 of any two adjacent electroluminescent devices, and the electrodes 7 of the electroluminescent devices extend to side walls of the convex structure 12, respectively, as shown by a dotted line circle in FIG. 1.

In some implementations, in order to prevent light emitted by the electroluminescent device being irradiated to the thin film transistor and affecting properties of the thin film transistor, an orthographic projection of the first electrode 7 of the electroluminescent device on the base substrate 10 fully covers an orthographic projection of the thin film transistor on the base substrate 10.

In the method for manufacturing the array substrate of the embodiment, the convex structure 12 is provided between the first electrodes 7 of any two adjacent electroluminescent devices, and the first electrodes 7 of the electroluminescent devices extend to the side walls of the convex structure 12, thus most light emitted by the light emitting layer 9 of the electroluminescent device is reflected to the second electrodes 11 by the first electrodes 7 and then is emitted toward outside. Since the first electrode 7 extends to the side walls of the convex structure 12, light leakage at an edge of the first electrode 7 is reduced significantly or avoided, and a light emitting area of the electroluminescent device is increased. Since the light leakage at the edge of the first electrode 7 is reduced significantly or avoided, a case where the thin film transistor of each pixel unit is irradiated by the light leakage at the first electrode 7 of the electroluminescent device in an adjacent pixel unit is avoided, thereby a relatively large threshold voltage shift of the thin film transistor is avoided, and a stability of the thin film transistor is improved.

In the embodiment, as shown in FIG. 1, the convex structure 12 is formed as a structure with narrow top and wide bottom, that is, the convex structure 12 is formed so that an end of the convex structure 12 proximal to the base substrate 10 is wider than an end of the convex structure 12 distal to the base substrate 10, and the side walls of the convex structure 12 are inclined, the first electrode 7 of the electroluminescent device is formed so that a portion of the first electrode 7 of the electroluminescent device which extends to the side wall of the convex structure 12 is conformal to the side wall of the convex structure 12 (i.e., is also inclined), thereby facilitating to reflect most light emitted by the light emitting layer 9 of the electroluminescent device to the second electrodes 11 and then emit the light toward outside.

It should be noted that, one of the first electrode 7 and the second electrode 11 of the electroluminescent device is an anode, and the other one thereof is a cathode. For example, in the embodiment, the first electrode 7 of the electroluminescent device is the anode, and the second electrode 11 is the cathode; or, the first electrode 7 of the electroluminescent device is the cathode, and the second electrode 11 is the anode.

In some implementations, an interlayer insulation layer 6 is provided between the thin film transistor and the first electrode 7 of the electroluminescent device, the convex structure 12 is arranged on the interlayer insulation layer 6, and the first electrode 7 of the electroluminescent device extends to the side wall of the convex structure 12. It should be noted that, each of both ends of the first electrode 7 extends to the side wall of the convex structure 12 closest thereto.

In some implementations, the interlayer insulation layer 6 includes a planarization layer 61, and the convex structure 12 and the planarization layer 61 are formed by a single layer. That is, the convex structure 12 and the planarization layer 61 are formed simultaneously by a single patterning process, thus the convex structure 12 is formed without increasing processes and production cost.

In some implementations, the interlayer insulation layer 6 further includes a passivation layer 62 provided between the thin film transistor and the planarization layer 61, the passivation layer 62 can prevent water vapor, oxygen or the like from contaminating the thin film transistor and the electroluminescent device. In this case, the first electrode 7 of the electroluminescent device can be connected to the thin film transistor through a via hole penetrating through the planarization layer 61 and the passivation layer 62.

The thin film transistor formed in the embodiment includes any of a polycrystalline silicon thin film transistor, an amorphous silicon thin film transistor, and an oxide thin film transistor. Certainly, the present disclosure is not limited to form these types of thin film transistors, and other types of thin film transistors can also be formed.

In some implementations, a top-gate thin film transistor can be formed, and for example, there is no overlapping region between a gate and a source/drain of a self-aligned top-gate thin film transistor, thus the self-aligned top-gate thin film transistor has a small parasitic capacitance and a small delay. In a case where the self-aligned top-gate thin film transistor is applied in the array substrate, a high switching speed is obtained, thereby it is easy to achieve a high resolution display.

As shown in FIG. 1, in the thin film transistor formed in the embodiment, a gate 3 is arranged above an active layer 1, thus, after forming the gate 3, a source contact region and a drain contact region of the active layer 1 are made to be conductive by using the gate 3 as a mask, so that there is a good conductivity between the active layer 1 and the source 51/the drain 52, which can reduce one mask process. Certainly, the thin film transistor formed in the embodiment can also be a bottom-gate thin film transistor, that is, a gate of the thin film transistor is formed below an active layer thereof.

It should be noted that, in practical applications, the source and the drain of the thin film transistor formed in the embodiment are exchangable, and correspondingly, the source contact region and the drain contact region of the active layer are also exchangable.

In some implementations, the active layer 1 of the thin film transistor formed in the embodiment includes a zinc-oxide-based material, or includes a material of polycrystalline silicon, amorphous silicon or the like.

In the method for manufacturing the array substrate of the embodiment, the plurality of pixel units may be formed by a patterning process, and the patterning process may only include a photolithography process, or may include the photolithography process and an etching process, or may further include other processes for forming a predetermined pattern, such as printing, injecting. The photolithography process includes procedures of film forming, exposing, developing etc. and is a process for forming a predetermined pattern by using photoresist, a mask, an exposure machine and so on, and a corresponding patterning process is selected as actual required.

FIG. 2 shows a flowchart of a method for manufacturing an array substrate in an embodiment of the present disclosure. In conjunction with FIG. 1 and FIG. 2, the method includes following steps 1-6.

At step 1, a pattern including an active layer 1 of a thin film transistor is formed on a base substrate 1 by a patterning process.

At this step, the base substrate 10 is prepared by using a transparent material such as glass, and is cleaned in advance. A semi-conductive material layer is formed on the base substrate 10 by sputtering, thermal evaporation, plasma enhanced chemical vapor deposition (PECVD), low-pressure chemical vapor deposition (LPCVD), atmospheric pressure chemical vapor deposition (APCVD) or electron cyclotron resonance chemical vapor deposition (ECR-CVD), and then the pattern including the active layer 1 of the thin film transistor is formed by a patterning process.

In the embodiment, the active layer 1 may include a zinc-oxide-based material, such as indium gallium zinc oxide (IGZO).

At step 2, a pattern including a gate insulation layer 2 and a gate 3 is formed above the active layer 1 by a patterning process.

At this step, first, a gate insulation material layer is formed above the active layer 1 by sputtering, thermal evaporation, plasma enhanced chemical vapor deposition, low-pressure chemical vapor deposition, atmospheric pressure chemical vapor deposition or electron cyclotron resonance chemical vapor deposition, and then a gate metal layer is formed on the gate insulation layer by sputtering, thermal evaporation, plasma enhanced chemical vapor deposition, low-pressure chemical vapor deposition, atmospheric pressure chemical vapor deposition or electron cyclotron resonance chemical vapor deposition.

Subsequently, a pattern including the gate 3 and the gate insulation layer 2 below the gate 3 is formed simultaneously by using a half tone mask (HIM) or a gray tone mask (GTM) through a patterning process (film forming, exposure, developing, wet etching or dry etching). The gate metal layer and the gate 3 are formed of a conductive material such as metal or metal alloy (e.g., molybdenum, molybdenum niobium alloy, aluminum, aluminum neodymium alloy, titanium or copper etc.). The gate insulation material layer and the gate insulation layer 2 are formed of an insulation material such as silicon oxide, silicon nitride and silicon oxynitride.

In some implementations, the gate 3 may be formed by a patterning process first, and then the gate 3 is used as a mask to etch the gate insulation material layer so as to form a pattern of the gate insulation layer 2, which is the same as the pattern of the gate 3.

In some implementations, step 2 may further include: using the gate 3 as a mask, doping regions (i.e., a source contact region and a drain contact region) of the active layer 1 corresponding to the source 51 and the drain 52 to be formed by ion implantation, so as to enhance ohmic contacts between the active layer 1 and the source 51/the drain 52.

In the embodiment, ion implantation includes ion implantation using a quality analyzer, ion cloud implantation without using the quality analyzer, plasma implantation or solid diffusion implantation.

At step 3, an interlayer dielectric layer 4 is formed above the gate 3, and the interlayer dielectric layer 4 is etched at positions corresponding to the source contact region and the drain contact region of the active layer 1 to form a source contact hole and a drain contact hole.

At this step, the interlayer dielectric layer 4 is formed above the gate 3 by sputtering, thermal evaporation, plasma enhanced chemical vapor deposition, low-pressure chemical vapor deposition, atmospheric pressure chemical vapor deposition or electron cyclotron resonance chemical vapor deposition, and then the source contact hole and the drain contact hole are formed in the interlayer dielectric layer 4 at positions corresponding to the source contact region and the drain contact region of the active layer 1 by an etching process. The interlayer dielectric layer 4 includes an insulation material such as silicon oxide, silicon nitride and silicon oxynitride.

At step 4, a pattern including the source 51 and the drain 52 of the thin film transistor is formed above the interlayer dielectric layer 4 by a patterning process.

At this step, a source/drain metal layer is formed above the interlayer dielectric layer 4 by sputtering, thermal evaporation, plasma enhanced chemical vapor deposition, low-pressure chemical vapor deposition, atmospheric pressure chemical vapor deposition or electron cyclotron resonance chemical vapor deposition, and then the pattern including the source 51 and the drain 52 is formed by a patterning process so that the source 51 is connected to the source contact region of the active layer 1 through the source contact hole and the drain 52 is connected to the drain contact region of the active layer 1 through the drain contact hole. The source/drain metal layer, the source 51 and the drain 52 are formed of a conductive material such as metal or metal alloy (e.g., molybdenum, molybdenum niobium alloy, aluminum, aluminum neodymium alloy, titanium or copper etc.).

At step 5, an interlayer insulation layer 6 and a convex structure 12 are formed above the source 51 and the drain 52.

In some implementations, the interlayer insulation layer 6 includes a passivation layer 62 and a planarization layer 61 arranged successively in a direction away from the base substrate 10.

At this step, the passivation layer 62 and the planarization layer 61 are successively formed above the source 51 and the drain 52 by sputtering, thermal evaporation, plasma enhanced chemical vapor deposition, low-pressure chemical vapor deposition, atmospheric pressure chemical vapor deposition or electron cyclotron resonance chemical vapor deposition, and then the planarization layer 61 is etched to form the convex structure 12 between any two adjacent pixel units. That is, the planarization layer 61 and the convex structure 12 are formed from a single layer by a single patterning process.

In the step of etching the planarization layer 61 to form the convex structure 12, the convex structure 12 is formed so that an end of the convex structure 12 proximal to the base substrate 10 is wider than an end of the convex structure 12 distal to the base substrate 10, and the side walls of the convex structure 12 are inclined.

Subsequently, a via hole penetrating through the passivation layer 62 and the planarization layer 61 is formed so that the first electrode 7 of the electroluminescent device to be formed is connected to the drain 52 of the thin film transistor.

At step 6, the first electrode 7 of the electroluminescent device is formed above the interlayer insulation layer 6.

At this step, a conductive metal film is deposited above the interlayer insulation layer 6 by sputtering, thermal evaporation, plasma enhanced chemical vapor deposition, low-pressure chemical vapor deposition, atmospheric pressure chemical vapor deposition or electron cyclotron resonance chemical vapor deposition. The conductive metal film has a high reflectivity, meets certain requirements of metal work function, and is usually formed as a double-layer structure or a triple-layer structure, such as a structure of ITO (indium tin oxide)/Ag (silver)/ITO (indium tin oxide) or a structure of Ag (silver)/ITO (indium tin oxide), or ITO in any of the above structures may be replaced with ILO (indium zinc oxide), IGZO (indium gallium zinc oxide), or InGaSnO (indium gallium tin oxide). Certainly, the conductive metal layer may also be formed of inorganic metal oxide, organic conductive polymer or a metal material having conductive performance and high work function, the inorganic metal oxide includes indium tin oxide or zinc oxide, the organic conductive polymer includes PEDOT:SS and PANT, and the metal material includes gold, copper, silver, or platinum. Then, the pattern of the first electrode 7 of the electroluminescent device is formed by a patterning process, and the first electrode 7 is connected to the drain 52 of the thin film transistor through the via hole penetrating through the passivation layer 62 and the planarization layer 61.

In the embodiment, in order to prevent light emitted by the electroluminescent device from being irradiating to the thin film transistor and resulting in a threshold voltage shift of the thin film transistor, an orthographic projection of the first electrode 7 of the electroluminescent device on the base substrate 10 fully covers an orthographic projection of the thin film transistor on the base substrate 10.

It should be noted that, each of both ends of the first electrode 7 extends to the side wall of the convex structure 12 closest thereto, and the portion of the first electrode 7 which extends to the side wall of the convex structure 12 is conformal to the side wall of the convex structure 12.

On a basis of the structure of the array substrate described above, a pixel definition layer (PDL) 8 may be further formed, then a light emitting layer (EL) is evaporated or coated, finally a second electrode 11 of the electroluminescent device is formed by sputtering or evaporation, and the resultant structure may be encapsulated to form the array substrate including the electroluminescent device.

Materials of the light emitting layer 9 and the second electrode 11 of the electroluminescent device are not limited herein, and persons skilled in the art can select the materials of the light emitting layer 9 and the second electrode 11 of the electroluminescent device as required.

An embodiment of the present disclosure provides a display apparatus including the array substrate of the embodiment described above.

In the embodiment, the display apparatus is a liquid crystal display apparatus or an electroluminescent display apparatus, and for example, may be any product or member having display function, such as liquid crystal display panel, electronic paper, electroluminescent display panel, mobile phone, tablet computer, television, display, notebook computer, digital photo frame and navigator.

With the array substrate of the embodiment described above, the display apparatus of the embodiment has a good display effect.

Embodiments and implementations described above are only exemplary embodiments and implementations for illustrating the principle of the present disclosure, and the present disclosure is not limited thereto. Various modifications and variants can be made by those ordinary skilled in the art without away from the essence of the present disclosure, and these modifications and variants also fall into the protection scope of the present disclosure.

The invention claimed is:

1. An array substrate, comprising a base substrate and a plurality of pixel units arranged on the base substrate, wherein each of the pixel units comprises a thin film transistor and an electroluminescent device, the thin film transistor and the electroluminescent device are successively arranged on the base substrate in a direction away from the base substrate, the electroluminescent device comprises a first electrode, a light emitting layer and a second electrode which are successively arranged in the direction away from the base substrate, and the first electrode comprises a reflective material, and a convex structure is provided between first electrodes of any two adjacent electroluminescent devices, and the first electrodes of the electroluminescent devices extend to side walls of the convex structure, respectively, and the first electrode of the electroluminescent device is provided above the thin film transistor, an interlayer insulation layer is provided between the first electrode of the electroluminescent device and the thin film transistor, the interlayer insulation layer comprises a planarization layer, the convex structure and the planarization layer are formed by a single layer and the convex structure is provided on the interlayer insulation layer.

2. The array substrate of claim 1, wherein the interlayer insulation layer further comprises a passivation layer formed between the thin film transistor and the planarization layer.

3. The array substrate of claim 1, wherein in each of the pixel units, the first electrode of the electroluminescent device is connected to the thin film transistor through a via hole penetrating through the interlayer insulation layer.

4. The array substrate of claim 1, wherein an end of the convex structure proximal to the base substrate is wider than an end of the convex structure distal to the base substrate, and the side walls of the convex structure are inclined.

5. The array substrate of claim 4, wherein a portion of the first electrode of the electroluminescent device which extends to the side wall of the convex structure is conformal to the side wall of the convex structure.

6. A display device, comprising the array substrate of claim 1.

7. A method for manufacturing an array substrate, wherein the array substrate comprises a plurality of pixel units, and each of the pixel units comprises a thin film transistor and an electroluminescent device, and the method comprises steps of:

forming the thin film transistor on a base substrate;

forming an interlayer insulation layer including a planarization layer and a convex structure above the thin film transistor such that the planarization layer and the convex structure are formed by a single patterning process with a same material, and the convex structure is formed on the interlayer insulation layer;

forming a first electrode comprising a reflective material, a light emitting layer and a second electrode of the electroluminescent device successively above the interlayer insulation layer such that the convex structure is formed between first electrodes of any two adjacent electroluminescent devices, and the first electrodes of the electroluminescent devices extend to side walls of the convex structure, respectively.

8. The method of claim 7, wherein the step of forming the thin film transistor on the base substrate includes sub-steps of:

forming a pattern including an active layer of the thin film transistor on the base substrate by a patterning process;

depositing a gate insulation material layer and a gate metal layer successively above the active layer, and forming a pattern including a gate insulation layer and a gate of the thin film transistor by a patterning process;

forming an interlayer dielectric layer above the gate, and etching the interlayer dielectric layer to form a source contact hole and a drain contact hole in the interlayer dielectric layer;

forming a pattern including a source and a drain of each thin film transistor above the interlayer dielectric layer by a patterning process such that the source is connected to the active layer through the source contact hole, and the drain is connected to the active layer through the drain contact hole.

9. The method of claim 7, wherein the step of forming the interlayer insulation layer comprises:

forming a passivation layer before forming the planarization layer.

10. The method of claim 7, wherein the convex structure is formed so that an end of the convex structure proximal to the base substrate is wider than an end of the convex structure distal to the base substrate, and the side walls of the convex structure are inclined.

11. The method of claim 10, wherein the first electrode of the electroluminescent device is formed so that a portion of the first electrode of the electroluminescent device which extends to the side wall of the convex structure is conformal to the side wall of the convex structure.

* * * * *